United States Patent [19]

Kchao et al.

[11] Patent Number: 5,751,217
[45] Date of Patent: May 12, 1998

[54] METHOD AND APPARATUS FOR ASSESSING AVAILABLE BATTERY LIFE IN A RECHARGEABLE BATTERY

[75] Inventors: Sokphal Kchao, Fort Lauderdale; Robert B. Ford, Tamarac, both of Fla.

[73] Assignee: Motorola, Inc., Schaumburg, Ill.

[21] Appl. No.: 595,154

[22] Filed: Feb. 1, 1996

[51] Int. Cl.$^6$ .................................................. G08B 21/00
[52] U.S. Cl. .................... 340/636; 340/635; 340/661; 324/426; 324/429; 324/430
[58] Field of Search .............................. 340/635, 636, 340/660, 661; 324/429, 430, 427, 428, 426; 320/43, 48

[56] References Cited

U.S. PATENT DOCUMENTS

| | | | |
|---|---|---|---|
| 3,877,001 | 4/1975 | Bogut et al. | 340/249 |
| 4,324,251 | 4/1982 | Mann | 607/30 |
| 4,423,379 | 12/1983 | Jacobs et al. | 324/429 |
| 4,638,237 | 1/1987 | Fernandez | 320/48 |
| 4,678,998 | 7/1987 | Muramatsu | 324/427 |
| 4,916,438 | 4/1990 | Collins et al. | 340/636 |
| 5,032,825 | 7/1991 | Kuznicki | 340/636 |
| 5,136,620 | 8/1992 | Eaves | 377/15 |
| 5,241,275 | 8/1993 | Fang | 324/430 |
| 5,281,919 | 1/1994 | Palanisamy | 324/427 |
| 5,281,920 | 1/1994 | Wurst | 324/430 |
| 5,365,453 | 11/1994 | Startup et al. | 364/481 |
| 5,438,270 | 8/1995 | Harper et al. | 324/429 |
| 5,479,085 | 12/1995 | Honda et al. | 320/48 |

Primary Examiner—Jeffery A. Hofsass
Assistant Examiner—Ashok Mannava
Attorney, Agent, or Firm—Barbara R. Doutre

[57] ABSTRACT

Available battery life of a rechargeable battery is assessed and indicated to a user (300). A temporary load is switched onto a fully charged battery (304, 308) and voltage measurements are taken in both unloaded and loaded conditions (306, 310). The battery's internal impedance is determined (312) based on the measured voltages and is compared to a predetermined threshold (314). The predetermined threshold is set based on a value representing a selected minimum available capacity of the battery. An indicator alerts the user as to the status (316, 318) of the available battery life of the battery.

12 Claims, 7 Drawing Sheets

METHOD AND APPARATUS FOR ASSESSING AVAILABLE BATTERY LIFE IN A RECHARGEABLE BATTERY

TECHNICAL FIELD

This invention relates in general to rechargeable batteries and more specifically to the determination of battery condition in rechargeable batteries.

BACKGROUND

Rechargeable batteries have a service life expectancy based on useful battery capacity. As a rechargeable battery goes through its normal charging and discharging service life, its available capacity diminishes. It is usually considered practical and economical for a user to replace a battery once the aging process reaches a stage where the battery is no longer able to provide acceptable portions of its rated discharge capacity. In certain applications for example, the service life of a battery can be deemed as useful if the capacity remains above 80% of its rated discharge capacity.

Most battery charger units provide a status indicator in the form of a display or light emitting diode (LED) to inform the user of the charging status of the battery. This status indicator, however, usually denotes only that the charging cycle is complete and that the battery is ready to be removed from the charger. Despite the fact that the battery has completed its charging cycle, it may be very old and no longer capable of providing sufficient capacity for the intended application. Today, the user of a rechargeable battery has no means of being notified about the usefulness of the battery in terms of its service life. False claims of inadequate charging can occur when in fact, the battery has simply run through its useful life expectancy.

An additional indication that informs the user of the available battery life, or remaining life expectancy, of a rechargeable battery would be a benefit to consumers. Informed decisions could then be made as to whether the battery is suitable for the intended application or whether a replacement battery is needed. An indication of the available battery life of a rechargeable battery would be especially beneficial when a user is faced with a mix of batteries and desires to avoid weak batteries.

Accordingly, there is a need for an apparatus and technique for determining the remaining life expectancy of a rechargeable battery.

DETAILED DESCRIPTION OF THE PREFERRED EMBODIMENT

While the specification concludes with claims defining the features of the invention that are regarded as novel, it is believed that the invention will be better understood from a consideration of the following description in conjunction with the drawing figures, in which like reference numerals are carried forward.

Figure 1:
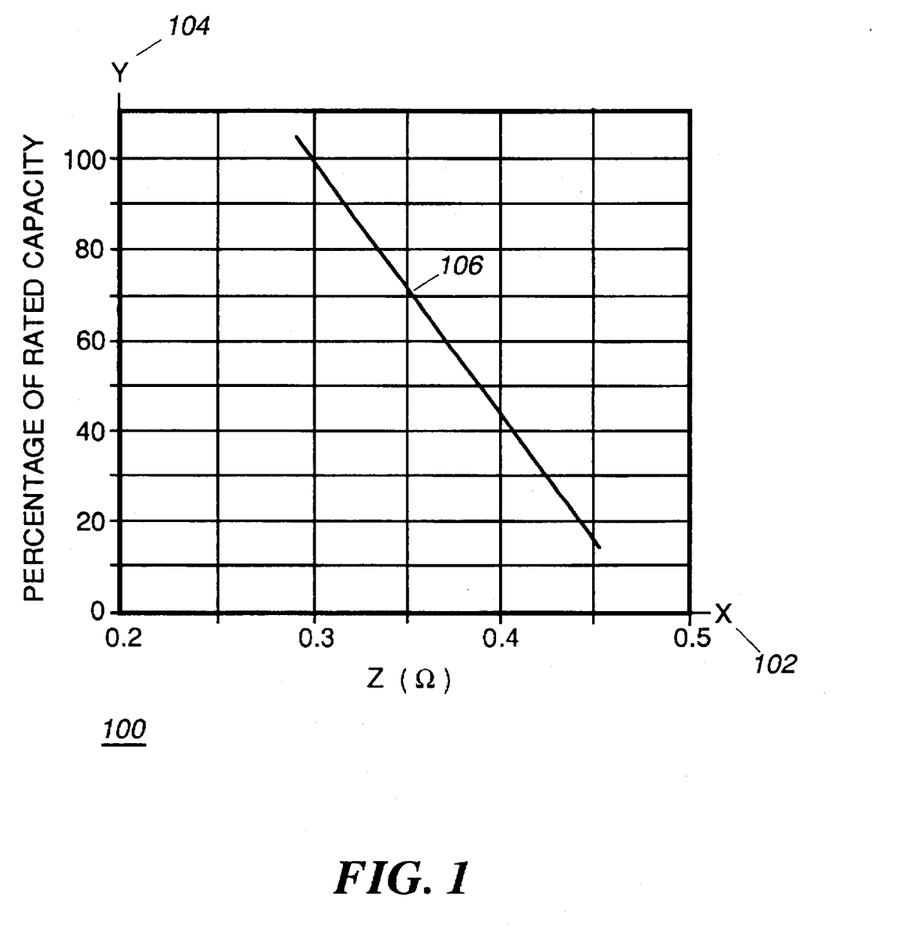
FIG. 1 shows a graph relating impedance and battery capacity of a fully charged battery in accordance with the present invention.

When new, a fully charged rechargeable battery is said to provide 100 percent of its rated capacity. At the beginning of its service life, the internal impedance of a rechargeable battery, when fully charged, is relatively low. The internal impedance increases as the battery ages through normal use charging and discharging cycles. The impedance change corresponds to the degradation of the discharge capacity of the battery. The effective capacity of a battery is the percentage of capacity available relative to its rated capacity. Characteristic curves can be drawn to relate impedance of a fully charged rechargeable battery as a function of effective capacity for various battery types. An example of such a curve, in accordance with the present invention, is shown in FIG. 1 of the accompanying drawings. Graph 100 shows the impedance (Z) measured in ohms ($\Omega$) of a fully charged battery along the X-axis 102 and percentage of rated capacity, or effective capacity, along the Y-axis 104. In this example, a fully charged battery reaching an impedance of 0.35 ohms has a capacity of approximately 70% of its original rated capacity still available as indicated by designator 106.

Figure 2:
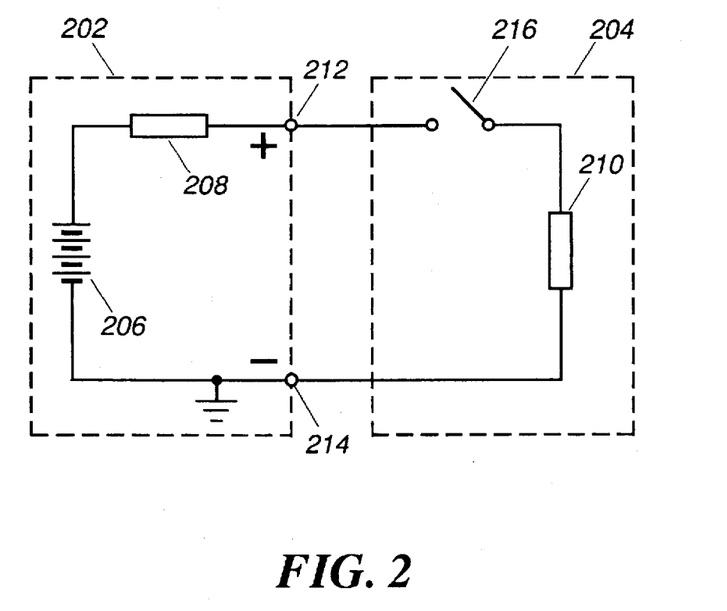
FIG. 2 shows a block diagram representing a fully charged rechargeable battery and impedance measurement circuit in accordance with the present invention.

In accordance with the present invention, the impedance measurement of a fully charged rechargeable battery is used to indicate the available battery life, or remaining life expectancy, of a battery of unknown age or condition. Referring now to FIG. 2, there is shown a block diagram of an apparatus representing a fully charged rechargeable battery 202 and impedance detection circuit 204 in accordance with the present invention. Battery 202 is represented by supply, $V_{Bat}$, 206 and an intrinsic series resistance, Zinternal, 208 representing the internal impedance of the battery. Basically the impedance detection circuit 204 operates by temporarily switching in a known load, Rload, 210, preferably a constant current sink, between the positive and negative output terminals 212, 214 of the battery 202. The known load 210 can be switched in using any well known mechanical or electronic switch 216. The battery voltage is measured at the output terminals 212, 214 under both loaded and unloaded conditions, and the measured voltages are then used to determine the internal impedance of the battery 202.

As an example, consider the following:

Vopen circuit (Voc) represents the open circuit voltage across the battery output terminals (212, 214) in the unloaded condition.

Vclosed circuit (Vcc) represents the closed circuit voltage across the battery output terminals (212, 214) in the loaded condition. If Voc=8 volts (becomes value of supply 206)

Vcc=7.6 volts and

Rload=8 ohms (or a 1C current sink)
note: C rate is defined as the current that discharges the capacity of a fully charged battery in one hour then, using voltage divider:

$$Vcc = \frac{Rload(Voc)}{Rload + Zinternal}$$

or, $$Z = Rload \left( \frac{Voc}{Vcc} - 1 \right)$$

the internal impedance can be calculated to be approximately 0.4 ohms. This impedance value can then be compared to a predetermined threshold and used as a basis for indicating strong and weak batteries with regard to available capacity. The threshold for determining strong or weak batteries can be chosen based on particular application needs. For example, batteries used in portable radio applications may operate optimally if at least 80 percent of the rated battery capacity is available. The threshold can then be based on this level. Additional thresholds can be added if there is a need to classify or partition the remaining life expectancy into more precise stages.

While the above example, calculates an impedance based on measured voltages, it would also be feasible to one skilled in the art to relate the voltage differential between the loaded and unloaded conditions as a delta measurement. This delta measurement could then be compared to a threshold(s) related to capacity level.

Figure 3:
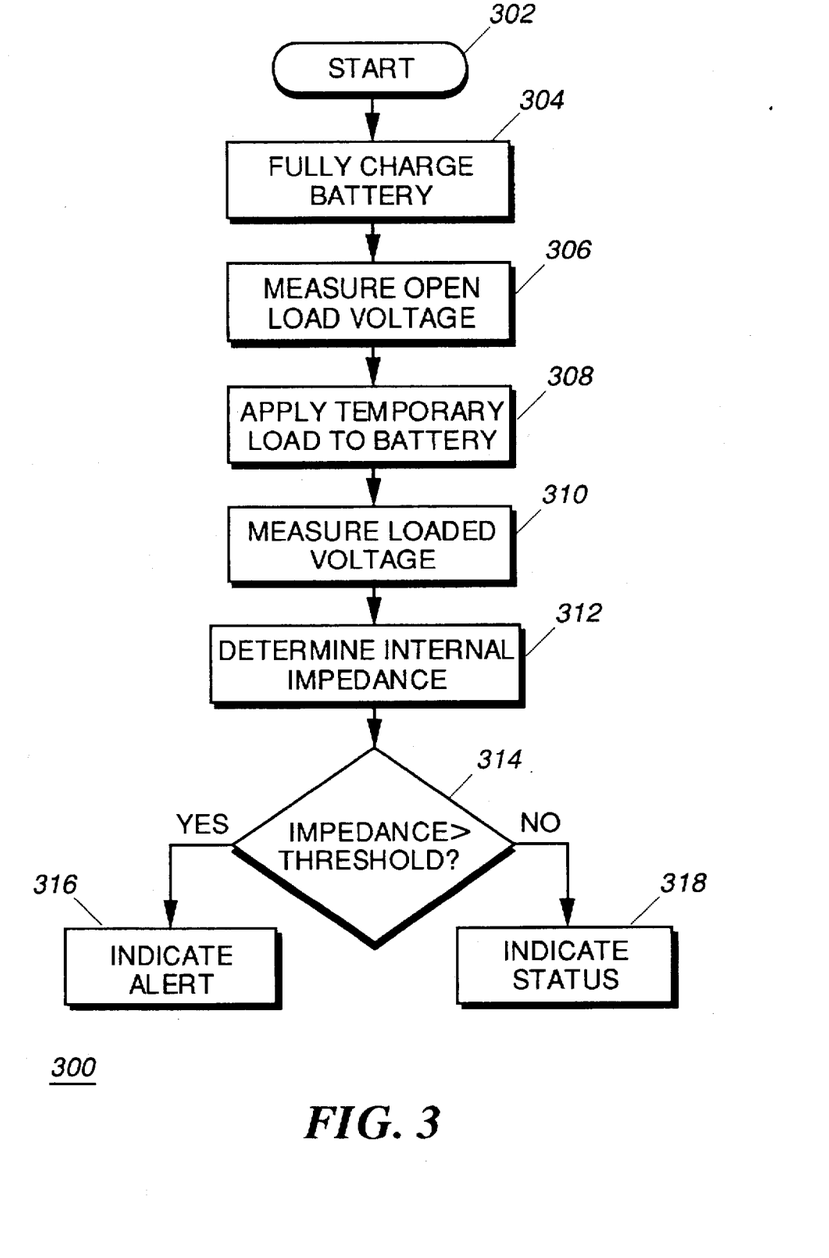
FIG. 3 shows a flowchart for assessing available battery life in accordance with the present invention.

Referring now to FIG. 3, there is shown a flowchart 300 representing a method of assessing available battery life in a rechargeable battery. The flowchart starts at step 302 and a fully charged battery is presented at step 304. The open load (or unloaded) battery voltage is measured at step 306. A known load is temporarily applied to the battery output terminals at step 308, and the loaded voltage is measured at step 310. The internal impedance of the battery is then determined at step 312 based on the values of the unloaded voltage, the loaded voltage, and the known temporary load. The impedance is then compared to a predetermined threshold at step 314. The predetermined threshold of step 314 preferably represents a minimum capacity level below which the usefulness of the battery may be questionable. If the determined impedance exceeds the predetermined threshold an alert indication can be presented to the user at step 316, such as through a display or light emitting diode (LED), to alert the user of a low capacity battery. If the impedance does not exceed the predetermined threshold at step 314 then an optional satisfactory status indicator can also be presented to the user at step 318.

One skilled in the art appreciates that the method of assessing available battery life as described by the invention is not limited to a single threshold. Additional threshold comparisons can be performed to provide further indicators, such as high, medium, and poor levels of available capacity. Furthermore, available battery life can also be expressed in terms of the number of remaining charge cycles with which a battery can be charged. The impedance measurement described in flowchart 300 can be related to charge cycles based on available capacity. Hence, a display could inform the user as to the number of charge cycles remaining for a battery.

The method of assessing available battery life as described by the invention is particularly useful when a user is faced with several fully charged batteries of unknown condition or age. If high capacity is critical to a certain application, these batteries can be selected using the method of assessing available battery life as described by the invention.

Figure 4:
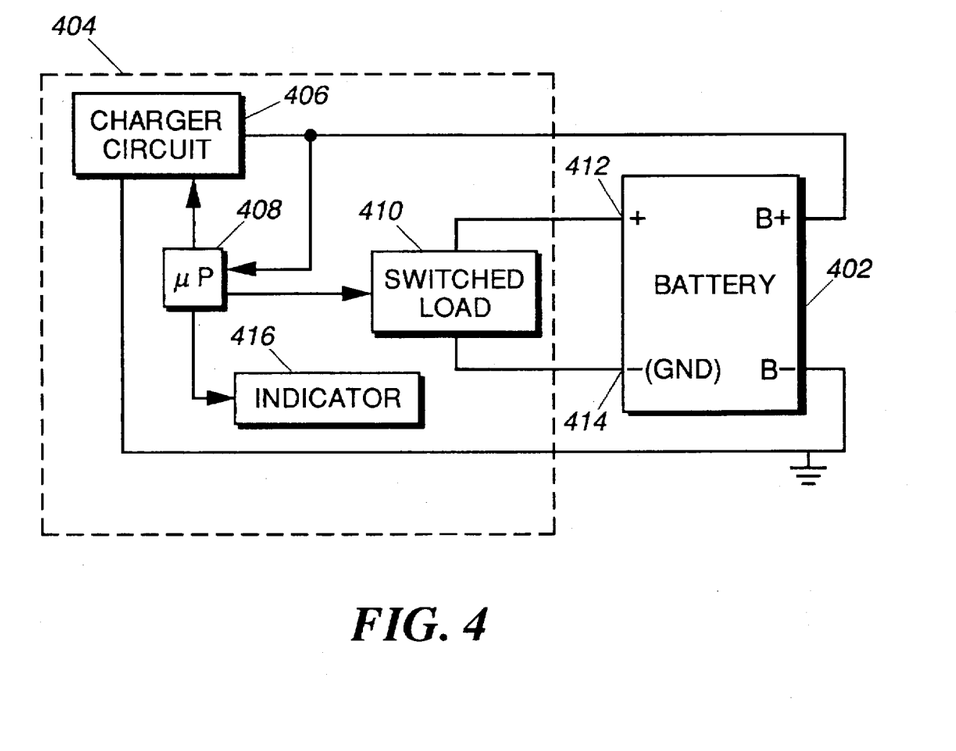
FIG. 4 shows a block diagram of a charger capable of assessing available battery life in accordance with the preferred embodiment of the invention.

Referring now to FIG. 4, there is shown a block diagram of a battery charger 404 capable of assessing available battery life in accordance with the preferred embodiment of the invention. In this embodiment of the invention, the battery 402 is charged through charging contacts B$^+$, B$^-$ by charger circuit 406 which is under the control of a microprocessor (µP) 408. Charger circuit 406 comprises well known charging circuitry which initially operates using rapid rate charging, such as a 1C rate, to charge the battery 402. Charger circuit 406 then completes charging the battery 402 using trickle rate charging which charges at a substantially lower rate, such as a 1/20C rate. Battery chargers typically switch from rapid charging rates to trickle charging rates when the battery has been charged to approximately 90% of its maximum capacity. For the purposes of this invention, a battery that has completed the rapid charge cycle is considered to be a fully charged battery.

In accordance with the present invention, microprocessor 408 momentarily switches a temporary load 410 across the battery's positive and negative output terminals, 412, 414, once the charger circuit 406 goes into a trickle charge mode of operation. Thus, the temporary load 410, also referred to as switchable load 410, is being applied only when the battery 402 has reached a fully charged condition. Status indicator 416, preferably an LED or display on the charger 404, indicates the life expectancy status of the battery 402 to the user. For example, a red LED can be illuminated to indicate that the available life expectancy of the battery is poor. A yellow LED can be illuminated to indicate that the available life expectancy is low, and a green LED can be illuminated to indicate that the available life expectancy is satisfactory. Status indicator 416 preferably remains displayed until the battery 402 is removed from the charger 404.

Figure 5:
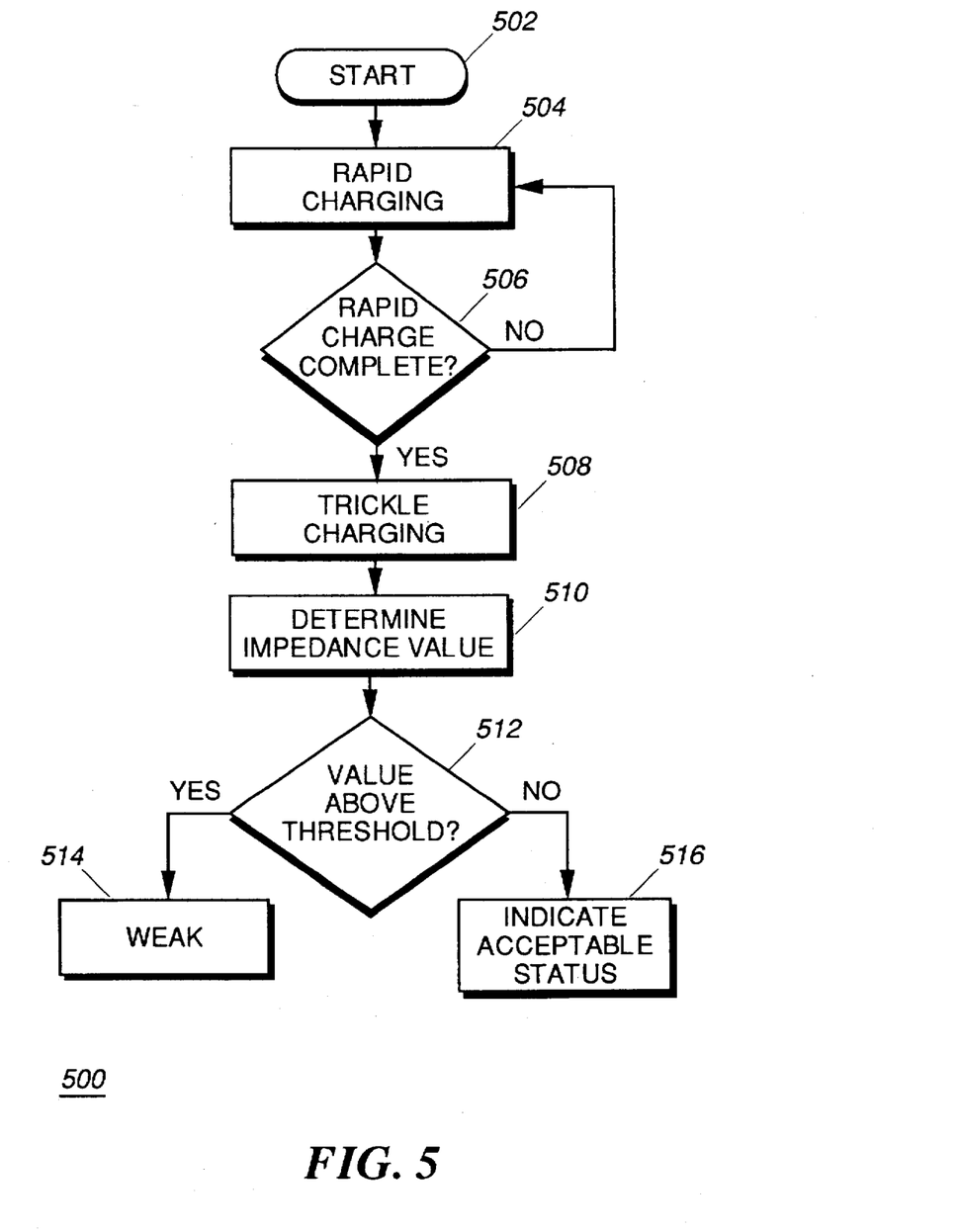
FIG. 5 shows a flowchart for assessing available battery life through the charger circuit described in FIG. 4 in accordance with the preferred embodiment of the invention.

FIG. 5 shows a flowchart 500 for assessing available battery life through the charger circuit described in FIG. 4 in accordance with the preferred embodiment of the invention. The flowchart 500 starts at step 502 where a battery is inserted into a charger and begins rapid charging at step 504. The charger then determines at step 506 whether the rapid charging cycle is complete and if so, proceeds to trickle charge the battery at step 508. Step 510 determines the impedance value of the battery by switching a known temporary load across the battery output terminals in the manner previously described. The impedance value is compared to a predetermined threshold at step 512. If the impedance value exceeds the threshold at step 512, the battery is considered weak and is so indicated at step 514, such as by illuminating an LED. If the impedance value does not exceed the predetermined threshold at step 512, then an acceptable indicator status is indicated at step 516.

Figure 6:
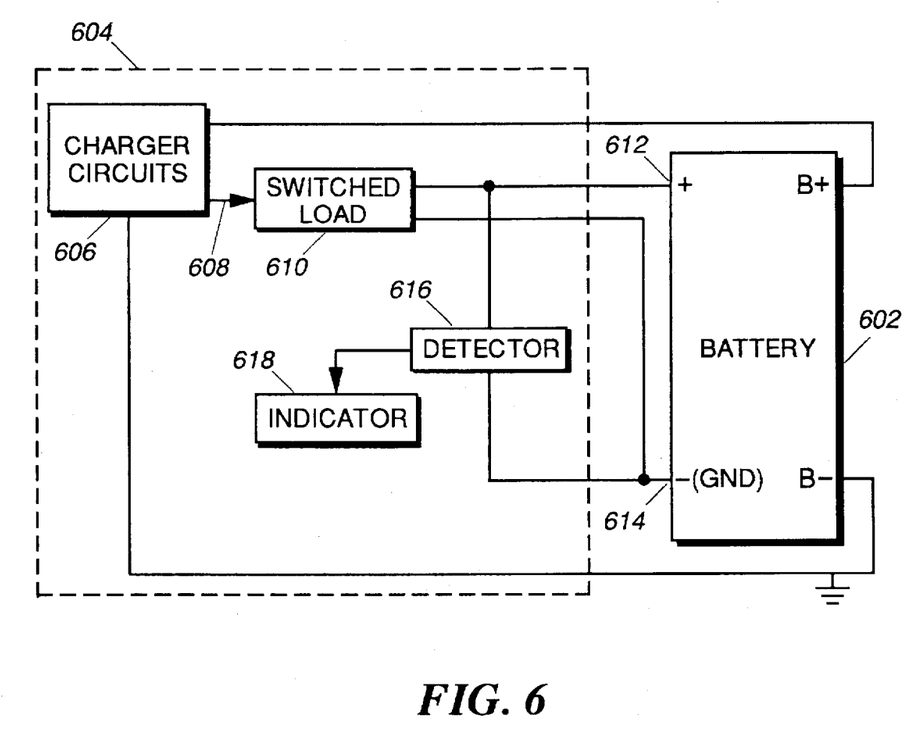
FIG. 6 shows another embodiment of a charger capable of assessing available battery life in accordance with the present invention.

FIG. 6 of the accompanying drawings shows another embodiment of a charger 604 capable of assessing available battery life in accordance with the present invention. In this implementation, an analog approach is employed to detect a voltage transition related to battery impedance, and therefore available battery capacity. Battery 602 is coupled to charger 604 which goes through the rapid charge mode of operation using a well known charger circuit 606. Once the charger circuit 606 switches to a trickle charge mode of operation, an enable signal 608 is generated to couple a switchable load 610 momentarily across the battery's positive and negative output terminals 612, 614. The voltage transition that then occurs is detected by a detector circuit 616. Detector 616 is biased to detect voltage transitions exceeding a predetermined minimum level. Once an excessive voltage drop is detected, detector 616 is then used to drive and latch a status indicator 618. For example, the detector circuit 616 can be biased to turn on and latch a red LED when the voltage transition between unloaded and loaded condition exceeds a 400 millivolt drop. This voltage transition would correspond to an increased impedance related to an unacceptable available battery capacity. Status indicator 618 preferably remains displayed until the battery 602 is removed from the charger 604.

Figure 7:
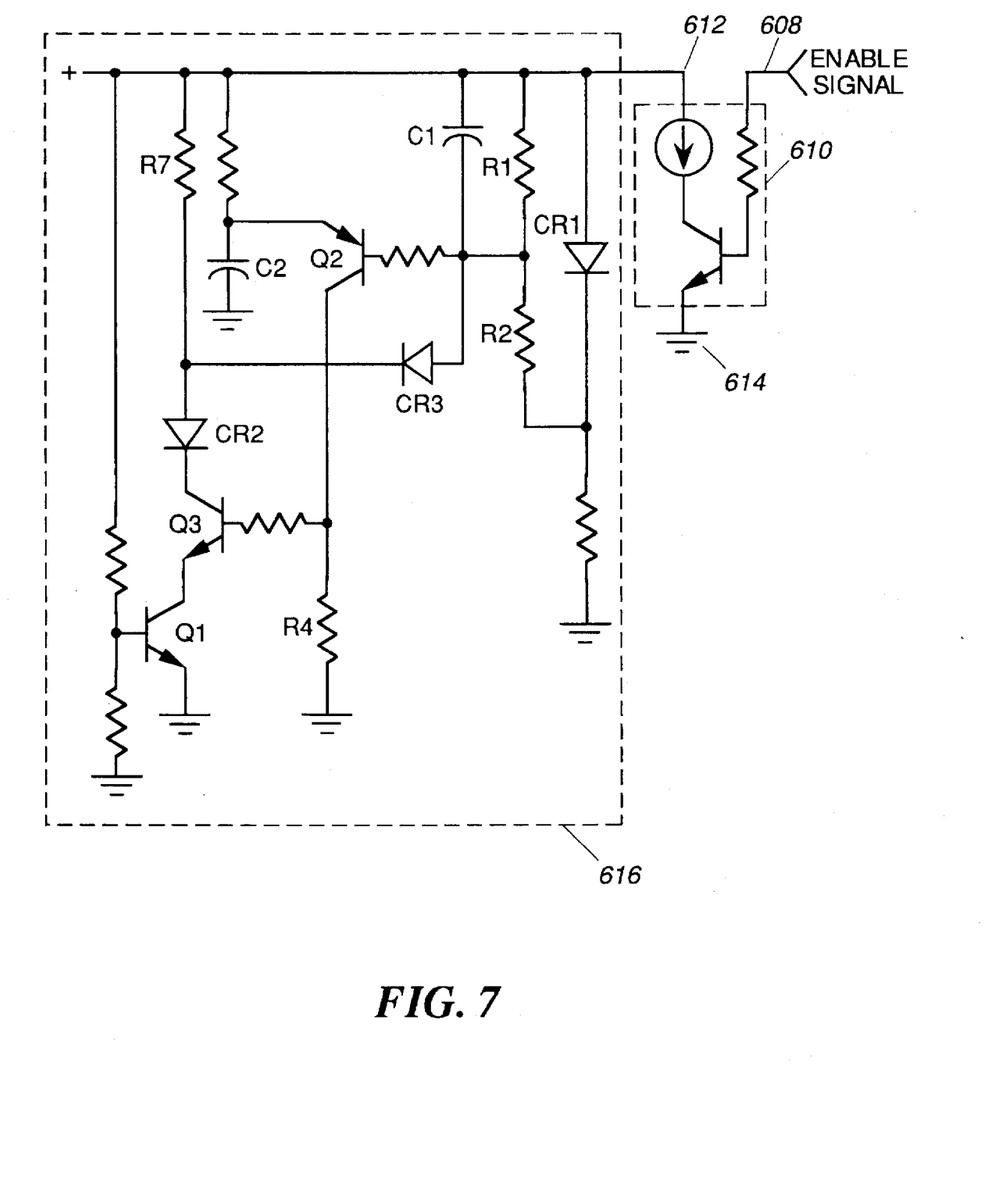
FIG. 7 shows an implementation of the detector of FIG. 6 in accordance with the present invention.

Referring now to FIG. 7, there is shown an implementation of the detector circuit 616 of FIG. 6. The detector circuit 616 is shown together with the switchable load 610, preferably a switched constant current sink or equivalent transistor switch and load resistor. The detector 616 detects the battery output voltage under both the loaded and unloaded conditions.

Resistor values R1 and R2 provide a prebias voltage to transistor Q2 and set the desired threshold of detection. The detector 616 is enabled or reset through transistor Q1. Transistor Q2 is used to latch an LED CR2 indicator when a voltage transition at the battery terminal 612 exceeds the threshold detection level set by resistors R1 and R2. The threshold level is controlled by the voltage drop across CR1 and the prebias value set by resistors R1 and R2. For example, a voltage drop across CR1 of 0.6 volts and a prebias value at capacitor C1 of 0.25 volts sets the threshold for 0.35 volts. If too great a delta voltage occurs when the load 610 is temporarily switched on, the detector latches to illuminate the LED indicator CR2. The LED indicator CR2 stays lit until the battery is removed, at which time the detector 616 is unlatched and ready for the next operation.

In operation, when a battery is coupled to a charger, the battery voltage present at the positive output terminal 612 will turn transistor Q1 on, turning on the detector 616. Before a detection event occurs, capacitor C2 charges to the voltage present on the battery's positive output terminal 612, and capacitor C1 charges to the prebias value set by resistors R1 and R2 thus maintaining transistor Q2 off. Transistor Q3 is cutoff due to a zero voltage drop across resistor R4, and thus LED CR2 is also turned off.

When the switched load 610 is placed across an aged battery, a voltage transition or dip on the $V_B$ terminal occurs. If this transition exceeds the threshold set by resistors R1 and R2, then transistor Q2 conducts and raises the voltage drop across resistor R4. The voltage drop across resistor R4 biases transistor Q3 into conduction, and transistor Q3 pulls LED CR2 and diode CR3 cathodes low. LED CR2 illuminates from current via resistor R7, and diode CR3 latches the detector by providing sustained base current to transistor Q2.

As an example, the threshold set by resistors R1 and R2 could be set to 0.35 volts to detect an aged or weak battery. If a switched load is placed across a battery, and a voltage transition of 0.4 volts occurs, the junction of capacitor C1 and resistors R1, R2 also dips with this transition. The threshold of 0.35 volts has now been exceeded, and the 0.4 volt transition is added to the prebias of 0.25 volts to provide a Q2 base bias of 0.65 volts which is adequate to cause Q2 conduction, and LED CR2 lights to indicate a weak battery. When the battery is removed, transistor Q1 turns off and the detector is reset/off.

Hence, there has been described an apparatus and technique for detecting and indicating the battery condition of a rechargeable battery. By indicating that a rechargeable battery has used its effective capacity, a user can now determine when batteries should be replaced. When implemented in a charging unit, a more informative charger is provided to the user and false claims of suspected charger problems are avoided. If a user has several batteries to sort through, the method of determining remaining battery life described by the invention can be a great asset in choosing batteries whether it be for discarding old batteries, or selecting acceptable batteries for a particular application.

The technique for determining and indicating available battery life is not limited to the use of chargers. One skilled in the art realizes that the technique of determining battery capacity described by the invention can also apply to products such as lap top computers or other electronic devices. As long as the rechargeable battery is fully charged, the technique of determining the available capacity via an impedance measurement as described by the invention can be applied.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of determining available battery life in a battery, comprising the steps of:

fully charging the battery by:
applying a rapid charge cycle to the battery, and applying a trickle charge cycle to the battery when the rapid charge cycle is complete;

determining an internal impedance of the fully charged battery once the trickle charge cycle has been applied; and assessing the available battery life based on the determined internal impedance.

2. A method as described in claim 1, wherein the step of assessing includes the steps of:

comparing the determined internal impedance to a predetermined threshold; and indicating whether the determined internal impedance exceeds the predetermined threshold.

3. A method as described in claim 2, wherein the step of indicating further includes the step of:

illuminating a light emitting diode (LED) when the determined internal impedance exceeds the predetermined threshold.

4. A method as described in claim 1, wherein the step of assessing includes the step of:

determining a number remaining charge cycles with which the battery can be charged based on the determined internal impedance.

5. A method of determining remaining life expectancy in a battery, comprising the steps of:

fully charging the battery by applying a rapid charge cycle to the battery until the rapid charge cycle is complete and then applying a trickle charge cycle to the battery;

measuring an unloaded voltage of the fully charged battery;

applying a temporary load to the fully charged battery;

measuring a loaded voltage of the fully charged battery; and assessing the remaining life expectancy based on the measured unloaded and loaded voltages.

6. A method as described in claim 5, wherein the step of assessing comprises the step of:

determining an internal impedance of the fully charged battery based on the temporary load, the measured unloaded voltage, and the measured loaded voltage.

7. A method as described in claim 5, wherein the step of assessing comprises the steps of:

detecting a voltage transition between the measured loaded and unloaded voltages; and comparing the voltage transition to a predetermined threshold.

8. A method as described in claim 7, wherein the temporary load comprises a switched constant current sink.

9. A method of assessing available battery life in a fully charged rechargeable battery that is being trickle charged, comprising the steps of:

measuring an output voltage of the fully charged battery in an unloaded condition;

measuring the output voltage of the fully charged battery in a loaded condition; and assessing the available battery life based on the output voltage measured in the unloaded condition and the output voltage measured in the loaded condition.

10. An apparatus for assessing available battery life of a fully charged rechargeable battery having positive and negative output terminals which is being trickle charged, comprising:

a switchable load for coupling to the fully charged rechargeable battery, the switchable load temporarily presenting loaded and unloaded conditions to the output terminals of the fully charged rechargeable battery;

a detector for assessing the available battery life based on detecting a voltage transition between the loaded and unloaded conditions; and an indicator for indicating when the voltage transition exceeds a predetermined threshold.

11. An apparatus as described in claim 10, wherein the switchable load comprises a switched constant current sink.

12. An apparatus as described in claim 10, wherein the apparatus resides in a battery charger.

\* \* \* \* \*